(12) United States Patent
Bargroff et al.

(10) Patent No.: US 7,526,264 B2
(45) Date of Patent: Apr. 28, 2009

(54) NXM CROSSPOINT SWITCH WITH BAND TRANSLATION

(75) Inventors: Keith Bargroff, San Diego, CA (US); Bert Fransis, San Diego, CA (US); Keith Rampmeier, San Diego, CA (US); Raducu Lazarescu, San Diego, CA (US); Kostas Papathanasiou, Houston, TX (US); Esa Tarvainen, San Diego, CA (US); Tony Mellissonos, Carlsbad, CA (US); Donghai Wang, San Diego, CA (US)

(73) Assignee: RF Magic, Inc., San Diego, CA (US)

( * ) Notice: Subject to any disclaimer, the term of this patent is extended or adjusted under 35 U.S.C. 154(b) by 48 days.

(21) Appl. No.: 11/537,628

(22) Filed: Sep. 30, 2006

(65) Prior Publication Data

US 2007/0087712 A1   Apr. 19, 2007

Related U.S. Application Data

(63) Continuation of application No. 10/734,604, filed on Dec. 11, 2003, now abandoned.

(60) Provisional application No. 60/433,066, filed on Dec. 11, 2002, provisional application No. 60/433,061, filed on Dec. 11, 2002, provisional application No. 60/433,067, filed on Dec. 11, 2002, provisional application No. 60/433,063, filed on Dec. 11, 2002.

(51) Int. Cl.
*H04B 1/06* (2006.01)
(52) U.S. Cl. ...................... 455/140; 455/3.02
(58) Field of Classification Search .............. 455/140, 455/553.1, 552.1, 3.02, 188.1
See application file for complete search history.

(56) References Cited

U.S. PATENT DOCUMENTS 4,345,251 A    8/1982   Begeman et al.

(Continued)

FOREIGN PATENT DOCUMENTS

DE    201 03 220 U    6/2001

(Continued)

OTHER PUBLICATIONS

Courtesy International Search Report for PCT/US03/39678 dated Jun. 21, 2004.

(Continued)

*Primary Examiner*—Edward Urban
*Assistant Examiner*—Adeel Haroon
(74) *Attorney, Agent, or Firm*—Clifford Perry; Bruce W. Greenhaus

(57) ABSTRACT

An N×M crosspoint switch allows a signal from any one of the N inputs to be routed to one or more of the M crosspoint switch outputs. The switches within the crosspoint switch can be configured as voltage mode or current mode switches. In voltage mode switching an input to the crosspoint switch is provided to an input device, such as an amplifier, having a low output impedance. The output of the low impedance device is provided to a switch that connects the output of the low impedance device to a high input impedance device, such as a band translation device. In current mode switching, the low impedance output of the input device is connected to selectively activated high isolation transconductance devices having high input impedances. The outputs of the transconductance devices are connected to low impedance devices that operate as summing nodes.

11 Claims, 6 Drawing Sheets

U.S. PATENT DOCUMENTS

| | | | |
|---|---|---|---|
| 4,705,967 A | 11/1987 | Vasile | |
| 4,931,802 A | 6/1990 | Assal et al. | |
| 4,953,184 A | 8/1990 | Simone | |
| 5,073,930 A | 12/1991 | Green | |
| 5,184,084 A | 2/1993 | Yun | |
| 5,220,419 A | 6/1993 | Sklar | |
| 5,278,837 A | 1/1994 | Kelley | |
| 5,285,284 A | 2/1994 | Takashima et al. | |
| 5,319,673 A * | 6/1994 | Briskman | 455/13.1 |
| 5,339,454 A | 8/1994 | Kuo | |
| 5,608,724 A | 3/1997 | Green, Jr. | |
| 5,654,774 A | 8/1997 | Pugel et al. | |
| 5,715,532 A | 2/1998 | Sagawa et al. | |
| 5,852,662 A | 12/1998 | Forgues | |
| 5,881,369 A | 3/1999 | Dean et al. | |
| 5,929,895 A | 7/1999 | Barry et al. | |
| 6,005,861 A | 12/1999 | Humpleman | |
| 6,072,994 A * | 6/2000 | Phillips et al. | 455/84 |
| 6,295,282 B1 | 9/2001 | Buer et al. | |
| 6,353,463 B1 | 3/2002 | Seo | |
| 6,408,164 B1 | 6/2002 | Lazaris-Brunner et al. | |
| 6,417,733 B1 | 7/2002 | Corsi et al. | |
| 6,434,374 B1 | 8/2002 | Mutterspaugh | |
| 6,437,837 B1 | 8/2002 | Seo | |
| 6,498,926 B1 | 12/2002 | Ciccarelli | |
| 6,509,777 B2 | 1/2003 | Razavi et al. | |
| 6,510,185 B2 | 1/2003 | Lee | |
| 6,584,304 B1 * | 6/2003 | Thomsen et al. | 455/188.1 |
| 6,882,834 B1 | 4/2005 | Balboni | |
| 6,987,958 B1 * | 1/2006 | Lo et al. | 455/269 |
| 2002/0057726 A1 | 5/2002 | Williams et al. | |
| 2003/0190900 A1 | 10/2003 | Yasuda et al. | |
| 2004/0203337 A1 | 10/2004 | Ammar | |

FOREIGN PATENT DOCUMENTS

| | | |
|---|---|---|
| EP | 0 757 489 | 2/1996 |
| EP | 1 009 113 | 6/2000 |
| WO | WO 97/49240 | 12/1997 |
| WO | WO 99/43104 | 8/1999 |
| WO | WO 00/22735 | 4/2000 |
| WO | WO 02/082671 | 10/2002 |

OTHER PUBLICATIONS

Courtesy International Search Report for PCT/US03/39741 dated Jun. 21, 2004.

Courtesy International Search Report for PCT/US03/39677 dated Sep. 23, 2004.

"Information for Installers of Hot Bird™ DVB-S Systems," Version 1.0, Jun. 7, 1999.

"Digital Satellite Equipment Control (DiSEqC™), Update and Recommendations for Implementation," Version 2.0, Apr. 18, 1997.

Kwentus et al., "A Single-Chip Universal Digital Satellite Receiver with 480-MHz IF Input," Nov. 1999, IEEE J. of S.S. Circ., vol. 34, No. 11, pp. 1634-1646.

Datasheet for Philips Semiconductors UAA3202M Frequency Shift Keying (FSK) Receiver, Aug. 1997.

"RCA DIRECTV™ Receiver with UltimateTV® Service Setup Guide," 2000.

* cited by examiner

NXM CROSSPOINT SWITCH WITH BAND TRANSLATION

PRIORITY APPLICATIONS

This application is a continuation of U.S. patent application Ser. No. 10/734,604, herein incorporated by reference, said U.S. patent application Ser. No. 10/734,604 claiming priority to, and incorporating by reference in their entirety, the following patent applications:

U.S. Provisional Patent Application No. 60/433,066, filed on Dec. 11, 2002, entitled INTEGRATED CROSSPOINT SWITCH WITH BAND TRANSLATION;

U.S. Provisional Patent Application No. 60/433,061, filed on Dec. 11, 2002, entitled IN-LINE CASCADABLE DEVICE IN SIGNAL DISTRIBUTION SYSTEM WITH AGC FUNCTION;

U.S. Provisional Patent Application No. 60/433,067, filed on Dec. 11, 2002, entitled N×M CROSSPOINT SWITCH WITH BAND TRANSLATION;

U.S. Provisional Patent Application No. 60/433,063, filed on Dec. 11, 2002, entitled MIXER WITH PASS-THROUGH MODE WITH CONSTANT EVEN ORDER GENERATION.

BACKGROUND OF THE INVENTION

1. Field of the Invention

The present invention relates to the field of electronic devices. More particularly, the invention relates to integrated circuit switches and frequency translation.

2. Description of the Related Art

Signal distribution systems are typically required to distribute a signal, such as an RF signal to one or more locations within the signal distribution system. The signal distribution system can be reconfigurable to allow routing of signals to be changed from an initial configuration. The reconfiguration of the signal distribution system can occur on-the-fly, while the system is in use. Reconfiguration of signal routing paths can be accomplished with switches.

However, switching transients can induce noise onto a signal distribution system and can affect the signal quality of other signal distribution paths. Additionally, switch isolation can affect signal quality of other signals in the signal distribution system. Low signal isolation may result in noise in the form of crosstalk from one signal path contaminating a second signal path. Changes in path loading, as a result of switching signal paths into and out of a signal path, can also result in increased noise or distortion in the signal path.

Signal distribution flexibility and the ability to reconfigure a signal distribution system on-the-fly is desirable. Yet signal degradation of signals distributed throughout the signal distribution system as a result of signal routing flexibility is to be minimized if signal quality is to be maintained within the signal distribution system. Within a reconfigurable signal distribution system, it is desirable to maintain signal isolation, minimize noise contributions including noise contributed by any switching transients, minimize signal distortion, and minimize current consumption.

SUMMARY OF THE INVENTION

According to one aspect of the invention, an N×M crosspoint switch allows a signal from any one of the N inputs to be routed to one or more of the M crosspoint switch outputs. The switches within the crosspoint switch can be configured as voltage mode or current mode switches. In voltage mode switching an input to the crosspoint switch is provided to an input device, such as an amplifier, having a low output impedance. The output of the low impedance device is provided to a switch that connects the output of the low impedance device to a high input impedance device, such as a band translation device. In current mode switching, the low impedance output of the input device is connected to selectively enabled high isolation transconductance devices having high input impedances. The transconductance devices operate as switches in the current mode switching device. The outputs of the transconductance devices are connected to low impedance devices that operate as summing nodes.

In another aspect, the switches are configured to provide high input to output signal isolation in a disabled state and connect the input to the output in an enabled state. The switch can provide voltage gain or current gain in the enabled state.

Additionally, in another aspect, the N×M crosspoint switch can be implemented as a single integrated circuit or can be implemented as multiple integrated circuits. The use of current mode switching or voltage mode switching is transparent to the user of the integrated circuit.

BRIEF DESCRIPTION OF THE DRAWINGS

The features, objects, and advantages of the invention will become more apparent from the detailed description set forth below when taken in conjunction with the drawings in which like reference characters identify correspondingly throughout and wherein.

DETAILED DESCRIPTION OF THE PREFERRED EMBODIMENT

Figure 1:
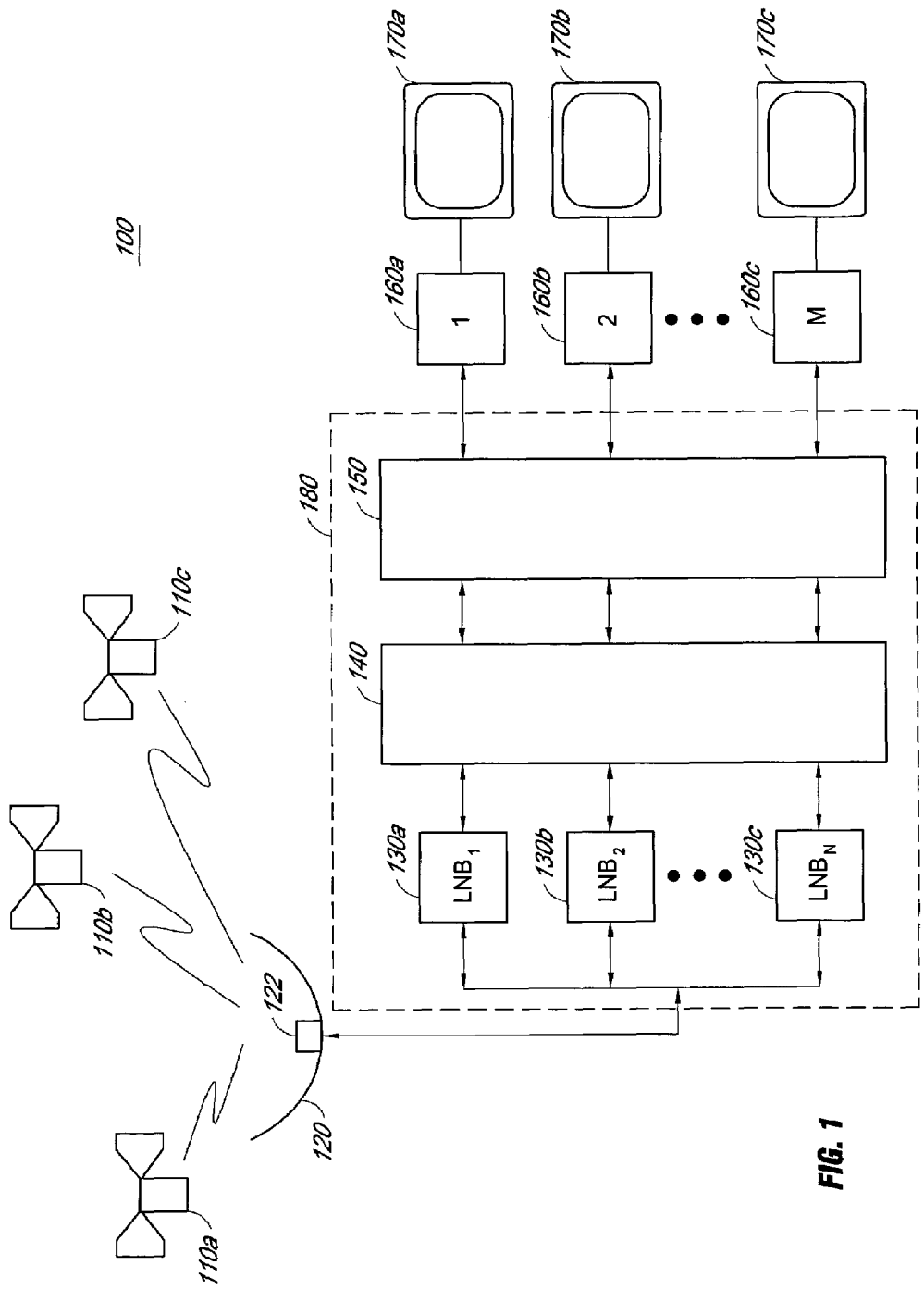
FIG. 1 is a functional block diagram of a satellite communication system configured to provide signals from multiple satellites to multiple user devices.

FIG. 1 is a functional block diagram of one embodiment of a satellite based communication system, such as a satellite television system 100. However, the invention is not limited to application in a satellite based communication system, nor is the invention limited to use in a television system. The invention is applicable to any communication system where multiple signals in one or more input frequency bands can be distributed as signals in one or more output frequency bands to one or more receivers.

The satellite television system 100 includes one or more satellites 110a-110c that are set at various different orbital slots. Although three satellites 110a-110c are shown in FIG. 1, any number of satellites can exist in a particular satellite television system 100. The satellites can operate at different carrier frequencies and polarizations. The different carrier frequencies and polarizations that can be used by the satellites 110a-110c provide a degree of isolation of one satellite transmission from another. Additionally, the satellites 110a-110c can implement a directional antenna to provide further signal selectivity. Thus, a receiver can select the signals from a desired satellite, for example 110a, by receiving the broadcast signals with a corresponding polarized antenna oriented in the general direction of the desired satellite 110a and tuning to the desired satellite frequency. Because each satellite 110a-110c is configured in a similar manner, a more detailed description is provided for only one of the satellites 110a.

A satellite 110a in a satellite television system 100 can include a single transponder (not shown), but typically includes multiple transponders. Each of the transponders typically transmits at a different frequency and has an associated polarization. Two different transponders on the same satellite 110a can transmit on the same frequency but with different polarities if the selectivity provided by the difference in polarities is sufficient for the system. If each transponder transmits at a different frequency, the different transponders on a single satellite 110a can all transmit with the same polarity, or can use different polarities.

Additionally, some transponders can be configured with multiple carrier frequencies having various channel offsets. Other transponders may multiplex numerous digital channels on a single carrier. The integrated crosspoint switch with band translation described below can be configured to operate over one or more frequency bands with any transponder modulation type.

For example, a satellite 110a can include a first transponder that provides information on multiple carrier frequencies, with the carrier frequency spacing corresponding to a channel spacing for a television receiver. The transponders in a satellite 110a are typically arranged as transponder groups. For example, the transponder group can be configured to provide a contiguous group of channels. Alternatively, the signals in a particular transponder group can have varied channel offsets, with one or more channels having different carrier bandwidths or symbol rates. Additionally, the transponders in a satellite group can be configured to all transmit using the same polarization. A typical satellite 110a configured for a satellite television system 100 can include two transponder groups having sixteen transponders in each transponder group, with each group having a different polarity. Of course, the satellite 110a is not limited to any particular transponder configuration, nor are transponder groups necessarily limited to sixteen transponders.

A satellite 110a configured to operate in a satellite television system 100 typically transmits downlink signals in one of two frequency bands. Each frequency band can include one or more channels corresponding to one or more transponders. A first downlink frequency band is in the C-band and typically spans 3.6-4.2 GHz. A second downlink frequency band is in the Ku-band and typically spans 10.7-12.75 GHz. Of course, each satellite or some other signal source may transmit signals over one or more frequency bands. The frequency bands are not limited to the two listed frequency bands, and may be any suitable frequency bands, including one or more frequency bands that have yet to be defined and allocated by regulating bodies.

Of course, the upper and lower band edges for the one or more downlink frequency bands are not absolutes because of the practical limitations on constructing a brick wall filter. Rather, the frequency bands typically represent passbands and the operating transponder downlink frequency band typically comprises a frequency band that includes a frequency band having the upper and lower band edges within the passband. Alternatively, the band edges can define stop band edges and the transponder can transmit a substantially diminished energy outside of the band edge frequencies. Thus, practically, the downlink frequency bands can span about, or substantially, 3.6-4.2 GHz and 10.7-12.75 GHz. Additionally, while a satellite 110a can be configured to use a particular downlink frequency band, the satellite 110a may not actually transmit signals at all frequencies within the downlink frequency band. A satellite 110a is not limited to transmitting a downlink signal in these two frequency bands, and there can be additional downlink frequency bands implemented by the satellite 110a. These additional downlink frequency bands can be distinct from the previously described downlink frequency bands or can overlap some or all of the previously described downlink frequency bands.

The downlink signals transmitted by the satellites 110-110c can be received by a terrestrial television system and displayed to one or more televisions 170a-170c. An antenna 120 is typically used to receive the signals from the satellites 110a-110c. The antenna 120 is shown in FIG. 1 as a dish antenna but other antenna 120 configurations can also be used. In the embodiment implementing a dish antenna 120, a reflector can direct the downlink signals to an antenna feed 122. Although the antenna 120 is shown with only one antenna feed 122, one or more antenna feeds 122 can be implemented on a single antenna 120. Some antenna configurations suitable for operation within the system can not include an antenna feed 122. The antenna 120 or antenna feed 122 can be configured to receive signals from a particular downlink frequency band or a particular polarization. For example, the antenna 120 and antenna feed 122 can be configured to receive the 10.7-12.75 GHz frequency band having a left hand circular polarization. Another antenna feed (not shown) included as part of the antenna 120 can be configured to receive another downlink frequency band having the same or different polarization. Additionally, although one antenna 120 is shown in FIG. 1, multiple antennae can be implemented in a location or multiple locations as part of a single system.

The output from the antenna 120 is connected to a receiver 180 that is used to process the received signals. In a typical satellite television system 100 the receiver 180 includes low noise amplifiers that amplify the signals while minimizing the associated noise contribution. Additionally, the signals received at the satellite downlink frequencies are typically frequency translated to one or more predetermined frequency bands, or common Intermediate Frequency (IF) bands. The received downlink signals can also be filtered to remove out of band signals that can contribute interference.

In one embodiment the carrier frequency spacing of the downlink signals transmitted by the satellites 110a-110c typically corresponds to a channel spacing used by a television receiver or a set top box. In this embodiment, it can be advantageous to frequency convert the entire received downlink frequency band to one of the predetermined frequency bands used by television receivers or set top boxes. Alternatively, the received downlink frequency band can be frequency converted to predetermined frequency bands at intermediate frequencies for further processing prior to conversion to frequencies compatible with television receivers or set top boxes. In another embodiment, several channels may be multiplexed using a single carrier. In this embodiment, one or more multiplexed carriers can be frequency converted to input frequencies of a set top box.

The process of low noise amplification, filtering and initial frequency conversion can be performed by low noise block converters (LNB) 130a-130c. Three LNB's are shown in FIG. 1, though fewer or more can be used. A LNB, for example 130a, can be configured to receive signals from one or more antennae, for example 120, amplify, filter, and block frequency convert the signals to a common IF band. A first set of downlink signals, such as those from a first transponder group, can be block converted to a first common IF band and a second set of downlink signals, such as those from a second transponder group, can be block converted to a second common IF band. For example, the LNB 130a can receive downlink signals from two transponder groups. The multiple signals from two transponder groups can be received at one or more antennae 120, or one or more antenna feeds 122. Additionally, the downlink signals can originate from one satellite, for example 110a, or more than one satellite 110a-110c.

For example, the LNB 130a can block convert the signals from the first transponder group to a common IF band of 950-1450 MHz. Similarly, the LNB 130a can simultaneously block convert the signals from the second transponder group to a common IF band of 1650-2150 MHz. The block converted signals at the two common IF bands can be combined prior to being output from the LNB 130a. This process of block converting two transponder groups to different predetermined frequency bands and then combining the signals from the predetermined frequency bands is commonly referred to as band-stacking. In the previous example, the band stacked output from the LNB 130 comprises block converted transponder signals in a first common IF band at 950-1450 MHz and block converted transponder signals in a second common IF band at 1650-2150 MHz. Conceivably, based on the channel spacing and carrier bandwidths employed in particular transponder groups, signals from two transponder groups can be block converted to the same common IF band and combined without having two channels assigned to the same carrier frequency. Typically, two independent signals would not be combined at the same IF carrier frequency because each would appear as an interference source for the other, potentially making both signals unresolvable. In systems such as TDM or CDM systems, two signals can occupy the same frequency space and still be independently resolvable provided they occupy different spaces in other dimensions, such as time or code.

If the number of transponder groups exceeds the number of predetermined frequency bands, or common IF bands, it may not be possible to band-stack the signals from all of the transponder groups. In such a situation, the band-stacked output from a particular LNB 130a may constitute only a subset of all available transponder groups. Additional LNB's 130b-130c can be used to ensure that signals from all of the transponder groups are represented in one of the band-stacked outputs of the LNB's 130a-130c. However, the band-stacked outputs of the LNB's 130a-130c are not limited to having signals from distinct transponder groups. Thus, one or more of the band-stacked LNB outputs can have signals in common with another of the band-stacked LNB outputs. In other embodiments, band-stacking is not used, and each transponder group is outputted from the LNB independently.

The outputs from the LNB's 130a-130c are connected to the input of a switch configuration, referred to herein as an N×M crosspoint switch 140. The N×M crosspoint switch 140 includes N inputs and M outputs. Signals from each of the N inputs can be selectively routed to any of the M outputs. Thus, the band-stacked output from a first LNB 130a can be connected to a first input of the crosspoint switch 140 and can be selectively routed to any of the outputs of the crosspoint switch 140.

The crosspoint switch 140 can be configured such that only one input can be selectively routed to an output. Alternatively, the crosspoint switch 140 can be configured to selectively route more than one input to the same output. Additionally, the crosspoint switch 140 can also be configured such that an input signal can be selectively routed to only one output. Alternatively, the crosspoint switch 140 can be configured to selectively route an input signal to more than one output. Typically, the crosspoint switch 140 is configured to selectively route an input to a single output and only one input can be routed to the particular output. Where the crosspoint switch 140 configuration limits one output to one input, there can be some inputs that cannot be routed to outputs if the number if inputs, N, is greater than the number of outputs, M. Similarly, some input signals can not be able to be routed to an output if the crosspoint switch 140 configuration limits an output to a signal from only one input, and one input can be routed to multiple outputs.

Conversely, some outputs can not have any signals routed to them if the crosspoint switch 140 configuration only allows one input to be routed to one output and the number of inputs, N, is less than the number of outputs, M. Similarly, some outputs may not have any signals routed to them if multiple inputs can be routed to the same output and an input can only be routed to one output. The crosspoint switches in each of the embodiments can be configured in the various alternatives discussed above.

Each of the outputs of the crosspoint switch 140 is coupled to a corresponding input to a band translation section 150. The band translation section 150 can represent an integrated device that is configured to independently provide frequency band translation to signals at each of its inputs. Alternatively, the band translation section 150 can represent a collection of one or more band translation devices that are configured to frequency band translate signals at each of the inputs. In one embodiment, the band translation section 150 can include one or more band translation devices configured to frequency band translate one or more signals using a common local oscillator. In another embodiment, the band translation section can include one or more band translation devices configured to independently frequency band translate each of the input signals.

In one embodiment, a band translation device within the band translation section 150 has an input connected to an output of the crosspoint switch 140. An output of the band translation device represents an output of the band translation section 150. The band translation device can be configured to selectively couple an input signal directly to the output with no frequency translation, or alternatively to frequency translate the input signal to an output signal at a frequency band that differs from the input frequency band. The frequency translation device can further be configured, such that when frequency translation is selected, to selectively frequency translate the input signal from a first one of the predetermined frequency bands to a second one of the predetermined frequency bands.

In the satellite television embodiment described above, there are two predetermined frequency bands. A first predetermined frequency band spans 950-1450 MHz and the second predetermined frequency band spans 1650-2150 MHz. In this embodiment, a band translation device can frequency translate an input signal at one of the two predetermined frequency bands to an output signal at one of the same two predetermined frequency bands. It can be seen that there are four distinct possibilities. An input signal in the lower of the two predetermined frequency bands, 950-1450 MHz, can be frequency translated by the band translation device to either the lower, or the upper, of the two predetermined frequency bands. Thus, in the example, the signal output from the band translation device can be in the lower predetermined frequency band, 950-1450 MHz, or the upper predetermined frequency band, 1650-2150 MHz. Of course, in one of the conditions, there is no frequency translation, but rather, the input signal is coupled directly from the input of the band translation device to the output of the band translation device.

The direct coupling from input to output without frequency translation can be referred to as a pass through state.

Similarly, an input signal provided to the band translation device at the upper frequency band can be output from the band translation device at the upper frequency band or the lower frequency band. In one state the band translation device is configured in pass through and in the other state the frequency translation device is configured to frequency translate the input signal.

The band translation section 150 can be configured to combine the outputs from one or more band translation section. Alternatively, external components (not shown) can combine one or more band translation device outputs.

Thus, a receiver 180 can implement the LNB's 130a-130c, the crosspoint switch 140, and the band translation section 150. The receiver 180 can implement all of these elements in a single integrated circuit or can implement one or more of the elements on separate integrated circuits or stand-alone devices. For example, the LNB's 130a-130c can each be implemented as stand-alone devices and the crosspoint switch 140 with the band translation section 150 can be implemented on a single integrated circuit. The LNB's 130a-130c, crosspoint switch 140 and band translation section 150 can be implemented in a single housing. This arrangement can be particularly advantageous where size of the components is of concern. Additionally, combining the crosspoint switch 140 with the band translation section 150 onto a single integrated circuit can greatly reduce the power requirements over a discrete configuration. Reducing the power requirements can result in additional advantages. For example, an integrated circuit crosspoint switch 140 and band translation section 150 having reduced power requirements may allow a system with a smaller power supply. Additionally, reduced power consumption typically corresponds to reduced heat dissipation. A system having reduced heat dissipation requirements can often use smaller heatsinks or may eliminate heatsinks. The use of smaller heatsinks can further reduce the size of the system. Additionally, an integrated circuit embodiment can advantageously have reduced cost as compared to a discrete system. The cost savings can be attributable to savings in components and materials that can be minimized or eliminated when the crosspoint switch 140 and band translation section 150 are configured as an integrated circuit.

In another receiver 180 embodiment, portions of the crosspoint switch 140 and portions of the band translation section 150 can be implemented on separate integrated circuits and one of the integrated circuits can be packaged within a LNB, for example 130a. In still another receiver 180 embodiment, the LNBs 130a-130c can be housed in a device that is remote from the crosspoint switch 140 and band translation section 150.

The outputs of the band translation section 150, and thus, the outputs of the receiver 180, are coupled to corresponding inputs of set top boxes 160a-160c. In the embodiment described, the predetermined frequency bands do not correspond to typical television receiver bands. Thus, the set top boxes 160a-160c can further frequency translate the signals to television receiver operating bands. Additionally, the output signals from the band translation section 150 can be in a format that is not compatible with standard television receivers 170a-170c. The set top boxes 160a-160c can then function as signal processing stages. For example, the satellite downlink signals can be digitally modulated in a format that is not compatible with a typical television receiver 170a-170c. The set top boxes 160a-160c can be configured to demodulate the digitally modulated signals, process the demodulated signals, and then modulate a television channel carrier frequencies with the signals for delivery to television receivers 170a-170c.

Alternatively, if the signals output from the band translation section 150 are in a format and are at a frequency band that is compatible with television receivers 170a-170c, the set top boxes 160a-160c may not be required. In still another alternative, one or more of the functions performed by the set top boxes 160a-160c can be integrated into the television receivers 170a-170c.

In the embodiment described in FIG. 1 and in the embodiments described in the other figures, each of the television receivers 170a-170c can be connected to an output from one of the set top boxes 160a-160c. Each of the set top boxes 160a-160c can have one or more individually programmable outputs. However, more than one television receiver 170a-170c can be connected to an output from a single set top box, for example 160a. Alternatively, outputs from more than one set top box 160a-160c, or multiple outputs from one set top box such as 160a, can be combined or otherwise connected to a single television receiver, for example 170a, although such a configuration is not typical. A television receiver, for example 170a, can be configured to tune to a particular channel within the one or more frequency bands provided by the set top box, such as 160a. The television receiver 170a can process the signal from the selected channel to present some media content, such as video or audio, to the user.

A user is typically provided control, such as through a remote control for the television 170a or set top box 160a, to selectively configure the crosspoint switch 140 or band translation section 150. For example, a user can be allowed to select, using a remote control configured to operate with the set top box 160a, to receive signals from two distinct satellite transponder groups.

One of the satellite transponder groups can be received and frequency converted to a common IF band using the first LNB 130a. The first LNB 130a can be configured to frequency convert the signals to the upper IF band, 1650-2150 MHz. The second of the satellite transponder groups can be received and frequency converted to a common IF band using the Nth LNB 130c. The Nth LNB 130c can also be configured to frequency convert the signals to the upper IF band, 1650-2150 MHz. The LNB's of the other embodiments can be similarly configured. Thus, the block converted signals from the two transponder groups would ordinarily not be combinable if any two channels in the two transponder groups share signal bandwidths in the common IF bands.

However, in this example, the crosspoint switch 140 can be configured by control signals to output the signals from the first LNB 130a to a first crosspoint switch output and to output the signals from the Nth LNB 130c to a second crosspoint switch output. The band translation section 150 can then be configured, using the control signals provided by the set top box 160a, to pass frequency translate the signals from the first switch output from the upper IF band to the lower IF band. The band translation section 150 can also be configured to pass through the signals from the second switch output without frequency translation. A combiner within the band translation section can be configured to combine the output signals from the first and second band translation outputs. The composite signal then includes the signals from the first transponder group, located at the upper common IF band, and the signals from the second transponder group, located at the lower common IF band.

Thus, the example can be generalized to allow signals from any N signal sources, which can be satellite transponder groups, to be combined to M distinct band stacked signals.

The band stacked signals can each include from one to M distinct frequency bands. Each of the band stacked signals can then be delivered to a set top box, multiple set top boxes, or one or more other receivers for presentation to one or more users.

For example, an output from a first output of the receiver 180 can be coupled to one or more set top boxes, for example 160a and 160b. Alternatively, multiple receiver 180 outputs that have information in mutually exclusive bands can be power combined and coupled to a single cable or distribution system for delivering the signal to one or more set top boxes or receivers. In still another embodiment, the crosspoint switch 140 may direct the same input signal to two separate inputs of the band translation section 150. The band translation section 150 may then frequency translate a portion of the input to a first frequency band and may also frequency translate a second portion of the input signal to a second frequency band. The two frequency bands can be combined into a signal that is directed to a single cable or distribution system. In still other embodiments, two separate LNB's with their own crosspoint switch with band translation section 150 having output signals in separate frequency bands can have their signals power combined at the LNB outside the house. In some embodiments, the LNBs 130a-130c, crosspoint switch 140 and band translation section 150 are implemented as a single device that may be placed, for example, at the antenna 120. In other embodiments, the LNBs 130a-130c may be implemented in a first device and the crosspoint switch 140 and band translation section can be implemented as one or more devices that can be located locally or remotely from the LNBs.

The LNB's 130a-130c, crosspoint switch 140, band translation section 150, and set top boxes 160a-160c can be assembled in many different configurations. In each configuration, multiple independent users can each select different channels from one or more independent signals without affecting other users or devices.

Figure 2:
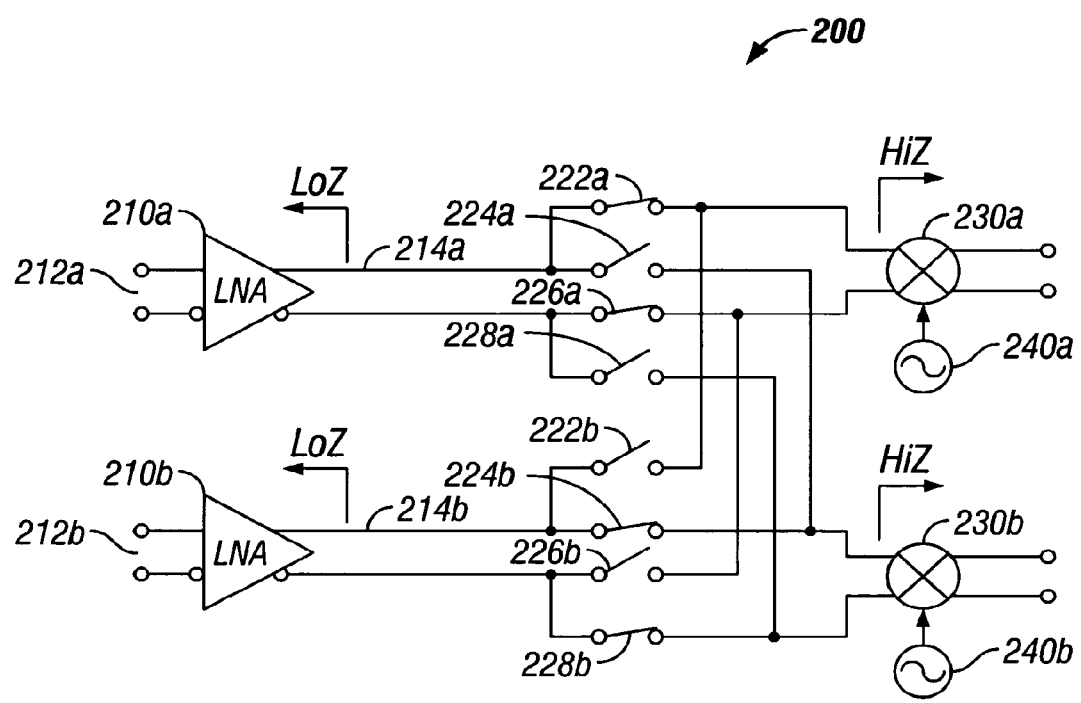
FIG. 2 is a functional block diagram of an integrated crosspoint switch with band translation.

FIG. 2 is a functional block diagram of a crosspoint switch with band translation 200. A two input and two output version of the receiver 180 of FIG. 1 can be implemented with the crosspoint switch with band translation 200 of FIG. 2 in combination with two LNB's. For example, the receiver of FIG. 1 can include LNB modules connected to an integrated circuit implementation of the crosspoint switch with band translation 200. This configuration of a receiver allows signal routing and band translation to be performed at a location physically close to the LNBs. The physical proximity of LNBs to the crosspoint switch with band translation 200 minimizes the loss and induced noise experienced by the received signals.

The crosspoint switch with band translation 200 is not limited to having only two inputs and two outputs. Other embodiments of the crosspoint switch with band translation 200 can include additional inputs and outputs. The number of inputs can be generalized to any number, N. The number of inputs, N, can be, for example, 2, 3, 4, 5, 6, 7, 8, 9, 10, 11, 12, 13, 14, 15, 16, or some other number. Similarly, the number of outputs can be generalized to any number, M. The number of outputs, M, can be, for example, 1, 2, 4, 6, 8, 10, 12, 14, 16, 18, 20, 22, 24, 26, 28, 30, 32, or some other number.

Additionally, the crosspoint switch with band translation 200 can be located remote from a signal source, such as an antenna or LNB modules. For example, one or more coaxial cables can couple the outputs from LNB modules to inputs of the crosspoint switch with band translation 200. In an example environment such as signal distribution within a residence, the LNB modules can be a distance of more than 250 feet away from the crosspoint switch and can couple to the LNB modules with coaxial cables.

The crosspoint switch with band translation 200 can be configured using differential signal interconnections to improve signal isolation. The device can be implemented with single ended signal interconnections but differential signal interconnections typically provide greater isolation. Signal isolation is of greater concern when the device is implemented in a single integrated circuit.

The crosspoint switch with band translation 200 has a first signal path and a second signal path. The first signal path includes a first low noise amplifier (LNA) 210a connected to an arrangement of switches, 222a, 224a, 226a, and 228a, that can selectively route a signal at the output 214a of the LNA 210a to a first band translation device 230a or a second band translation device 230b. The crosspoint switch with band translation 200 of FIG. 2 is configured to provide voltage-mode switching of the signals.

The first LNA 210a is configured with a differential input 212a and a differential output 214a. The differential input 212a of the first LNA 210a can be, for example, matched to 75 ohm differential. The differential output 214a of the first LNA 210a is configured to have a low impedance. The crosspoint switch with band translation 200 maximizes signal isolation and minimizes switching transients by connecting a high isolation switch configuration to the output of the first LNA 210a. Band translation devices 230a, 230b having high input impedances are connected to the outputs of the switch configuration.

In one embodiment, a low output impedance refers to a typical magnitude less than 10 ohms differential. In other embodiments, low impedances may refer to other impedance magnitudes that may be higher or lower than 10 ohms, and need not be defined differentially. For example, a low impedance can refer to a magnitude of substantially less than 33 ohms. In another embodiment, a high impedance refers to a magnitude of typically greater than 1 kohm differential. In other embodiments, high impedances may refer to other impedance magnitudes that may be higher or lower than 1 kohm, and need not be defined differentially. For example, in another embodiment, high impedance can refer to a magnitude of typically greater than 330 ohms. In general the terms low impedance and high impedance are defined relative to one another. That is, high impedance is defined to be greater than or equal to approximately ten times the low impedance value. Thus, for a low impedance value of 33 ohms, a high impedance value is greater than approximately 330 ohms.

The in-phase output of the first LNA 210a is connected to switches 222a and 224a that selectively switch the signal to the in-phase inputs of the band translation devices 230a, 230b based on switch control signals provided by, for example, the controller in the set top box 160a of FIG. 1. In an alternative embodiment, a microprocessor local to, or integrated with the crosspoint switch with band translation 200 can process signals, such as one or more control messages, from an associated set top box or receiver. The inverted phase output of the first LNA 210a is connected to switches 226a, 228a that selectively switch the signal to the inverted inputs of the band translation devices 230a, 230b. A switch connected to the in-phase output, for example 222a, is typically paired with a switch on the inverted output, for example 226a, such that a differential signal is selectively connected by the switch pair 222a, 226a.

Thus, the controller in the set top box can direct a first switch pair 226a, 226a to selectively connect the differential output of the first LNA 210a to the differential input of the first band translation device 230a. A second switch pair 224a, 228a selectively connects the differential output of the first LNA 210a to the second band translation device 230b.

The first band translation device 230a can selectively frequency translate the signal at its input to an output frequency band. The first band translation device 230a uses a signal from a first Local Oscillator (LO) 240a to perform the frequency translation.

A second signal path is configured similar to the first signal path. A second LNA 210b has a differential input 212b and a differential output 214b. The signal at the differential output 214b of the second LNA 210b is selectively connected to the first band translation device 230a using a third switch pair 222b, 226b. The signal at the differential output 214b of the second LNA 210b is selectively connected to the second band translation device 230b using a fourth switch pair 224b, 228b.

Typically, the signals from the first LNA 210a and the second LNA 210b are not switched to the same band translation device, for example 230a. The output of a single LNA 210a can be switched to both band translation devices 230a, 230b while the other LNA signal is not provided to any of the band translation devices 230a, 230b.

The crosspoint switch with band translation 200 is configured to provide high signal isolation between the input signals and the output signals from the LNA's 210a and 210b, and high isolation through the crosspoint switch section 222a-228b. Additionally, the crosspoint switch with band translation 200 provides high signal isolation at the input and output of the band translation devices 230a and 230b. Additionally, the crosspoint switch with band translation 200 has high signal isolation and low switching transients. Low switching transients are achieved through the use of low impedance at the LNA outputs combined with high impedance inputs at the band translation devices 230a, 230b. High signal isolation is achieved using differential signal configuration and is also achieved through the use of high isolation switches.

High signal isolation typically refers to greater than 30 dB of isolation. It may be advantageous to achieve a high signal isolation that is greater than approximately 40 dB. In general, high signal isolation can refer to greater than 20 dB, 25 dB, 30 dB, 35 dB, 40 dB, 45 dB, 50 dB or some other greater level of isolation.

FIGS. 3A-3D are embodiments of high isolation switches. Each of the switch embodiments of FIGS. 3A-3D are single-ended configurations. The switch embodiments can be duplicated to allow switching of in-phase and inverted signals of differential signals. Thus, a pair of switches from FIGS. 3A-3D can be used as the switch pairs of FIG. 2.

Figure 3A:
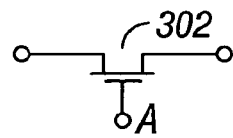
FIGS. 3A-3D are functional block diagrams of switches.

FIG. 3A is a first switch embodiment having a single transistor 302 controlled to selectively connect a signal from its input to its output based on the signal applied to the control input. The transistor 302 can be controlled to selectively isolate a signal at its input from its output based on the signal applied to its control input. Signal isolation is controlled by the ability of the transistor 302 to isolate the input from the output. A pair of transistors 302 can be used to switch differential signals.

Figure 3B:
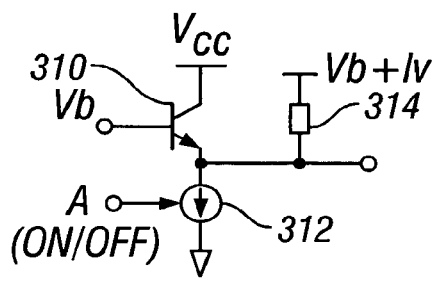

FIG. 3B is a second switch embodiment. A signal is input at the base of a first transistor 310 configured as an emitter follower. Additionally, a bias voltage, which is typically a DC bias voltage, is applied to the base of the first transistor 310. The emitter of the first transistor 310 is selectively biased with a controllable current source 312. The first transistor 310 selectively couples a signal from its base to its emitter when the controllable current source 312 conducts. Conversely, a signal at the base of the first transistor 310 is isolated from the emitter when the controllable current source 312 is off. A pull up device 314 connects the emitter of the first transistor 310 to a voltage that is greater than the bias voltage, for example ($V_b$+1V) to ensure the first transistor 310 is cut off when the controllable current source 312 is off.

Figure 3C:
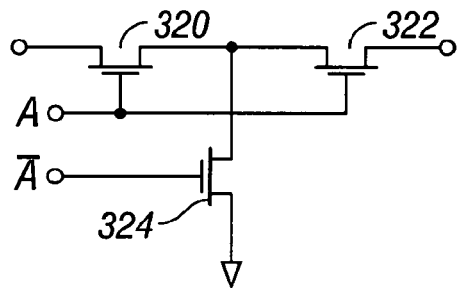

FIG. 3C is a third switch embodiment having multiple transistors configured to provide increased signal isolation. A signal is provided to a first transistor 320. The output of the first transistor 320 is connected to an input of a second transistor 322. The output of the second transistor 322 is the output of the switch. A third transistor 324 is connected to the output of the first transistor 320 and is configured to selectively couple the output of the first transistor 320 and input of the second transistor 322 to ground or signal return.

A differential control signal is used to control the third switch embodiment. An in-phase control signal controls the first transistor 320 and second transistor 322. An inverted control signal controls the third transistor 324. Thus, when the first and second transistors 320, 322 are controlled to be conducting, the third transistor 324 is controlled to be cut off. Conversely, when the first and second transistors 320, 322 are controlled to be cut off, the third transistor 324 is controlled to be conducting.

Figure 3D:
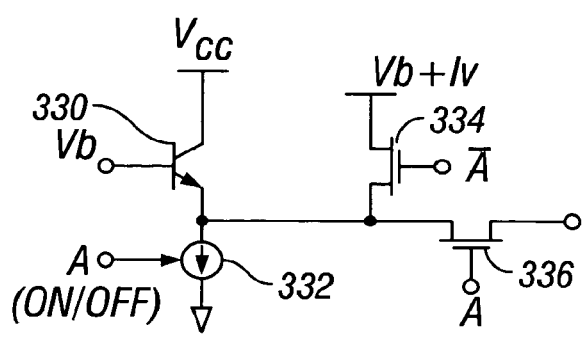

FIG. 3D is a fourth switch embodiment. The fourth switch embodiment is similar to the second switch embodiment with additional transistors configured to provide additional signal isolation.

A signal is input at the base of a first transistor 330 configured as an emitter follower. Additionally, a bias voltage, $V_b$, which is typically a DC bias voltage, is applied to the base of the first transistor 330. The emitter of the first transistor 330 is selectively biased with a controllable current source 332. The first transistor 330 selectively couples a signal from its base to its emitter when the controllable current source 332 conducts. Conversely, a signal at the base of the first transistor 330 is isolated from the emitter when the controllable current source 332 is off.

A second transistor 334 is configured to selectively pull up the emitter of the first transistor 330 to a voltage that is greater than the bias voltage, for example ($V_b$+1V), to ensure the first transistor 330 is cut off when the controllable current source 332 is off. Additionally, the second transistor 334 can also shunt any signal leakage at the emitter node to AC ground via the bias point, thus improving signal isolation. A third transistor 336 has an input connected to the emitter of the first transistor 330 and an output that is the output of the switch. The third transistor 336 is selectively controlled to couple the signal from the emitter of the first transistor 330 to the switch output when the controllable current source 332 is conducting. The third transistor 336 is selectively controlled to isolate the signal from the emitter of the first transistor 330 when the controllable current source is off.

Figure 4:
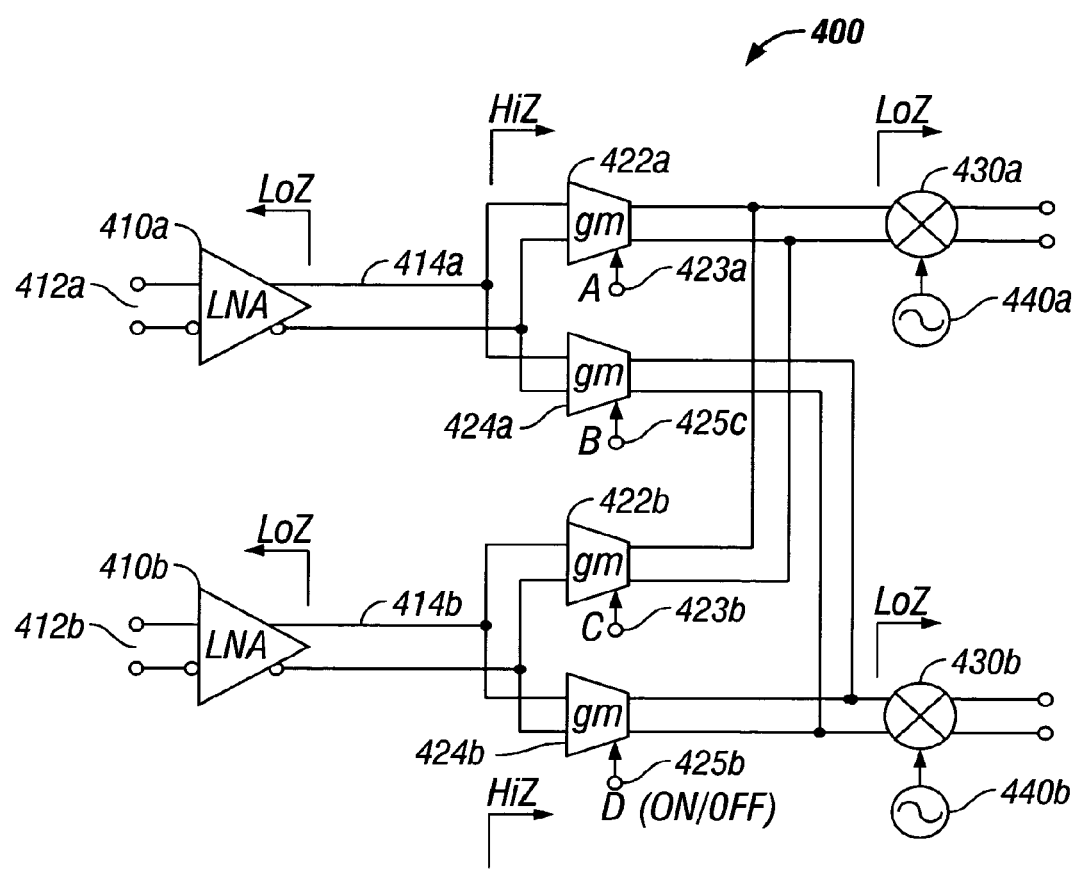
FIG. 4 is a functional block diagram of an integrated crosspoint switch with band translation.

FIG. 4 is a functional block diagram of a crosspoint switch with band translation 400 that can also be integrated as a portion of the receiver 180 of FIG. 1. A two input and two output version of the receiver 180 of FIG. 1 can be implemented with the crosspoint switch with band translation 400 of FIG. 4 in combination with two LNB's.

The crosspoint switch with band translation 400 is similar to the crosspoint switch with band translation 200 of FIG. 2 with the exception that the device of FIG. 4 uses current mode switching while the device of FIG. 2 uses voltage mode switching. Thus, the crosspoint switch with band translation 400 can be used interchangeably with the device of FIG. 2. However, in some instances, current mode switching can be advantageous because of the ability to sum currents into a common node.

The crosspoint switch with band translation 400 has a first signal path and a second signal path. The first signal path includes a first LNA 410a connected to a pair of transconductance devices, 422a and 424a that can selectively route a signal at the output 414a of the LNA 410a to a first band translation device 430a or a second band translation device 430b. The crosspoint switch with band translation 400 uses the transconductance devices, for example 422a and 422b, to provide current-mode switching of the signals.

The first LNA 410a is configured with a differential input 412a and a differential output 414a. The differential input 412a of the first LNA 410a can be matched to 75 ohm differential. The differential output 414a of the first LNA 4110a is configured to have a low impedance. The crosspoint switch with band translation 400 maximizes signal isolation and minimizes switching transients by connecting high isolation transconductance devices, 422a and 424a, to the output of the first LNA 410a. Band translation devices 430a, 430b having low input impedances are connected to the outputs of the transconductance devices 422a and 424a.

The differential output 414a of the first LNA 410a is connected to the high impedance differential inputs of the transconductance devices 422a and 424a. The first LNA 410a can drive both transconductance devices 422a and 424a because the differential inputs of the transconductance devices 422a and 424a are high impedance.

Each of the transconductance devices 422a and 424a includes a control input, 423a and 425a respectively, that is used to switch the transconductance device 422a and 424a on or off. When the signal from the first LNA 410a is to be routed to the first band translation device 430a, the first transconductance device 422a is controlled to provide a current output to the input of the first and translation device 430a. Similarly, the second transconductance device 424a can be controlled to provide a current output to the input of the second band translation device 430b. One or more transconductance devices, for example 422a and 424a connected to an LNA 410a can simultaneously be enabled such that one input, for example a signal at 412a, can be routed to all band translation devices 430a and 430b.

The first band translation device 430a can selectively frequency translate the signal at its input to an output frequency band. The first band translation device 430a uses a signal from a first LO 440a to perform the frequency translation. The first band translation device 430a has a low impedance input and thus, operates as a current summing node for the currents from the transconductance devices 422a and 422b to which its input is connected.

A second signal path is configured similar to the first signal path. A second LNA 410b has a differential input 412b and a differential output 414b. The signal at the differential output 414b of the second LNA 410b is selectively connected to the first band translation device 430a using a third transconductance device 422b. The signal at the differential output 414b of the second LNA 410b is selectively connected to the second band translation device 230b using a fourth transconductance device 424b. The second band translation device 430b operates in conjunction with a second LO 440b.

The transconductance devices 422a, 422b, 424a, and 424b can be any type of transconductance devices, such as transistors, FETs, and the like. The transconductance devices 422a, 422b, 424a, and 424b have a high output impedance. Thus, multiple transconductance devices, for example 422a and 422b can selectively provide a signal to the same band translation device 430a without the output impedance of the first transconductance device 422a affecting the performance of the other transconductance device 422b. The low input impedance band translation device 430a operates as a current summing node.

In an alternative embodiment of the crosspoint switch with band translation 400, the LNA's 410a and 410b are omitted and the input signals are directly coupled to the inputs of the transconductance devices 422a, 422b, 424a, and 424b. The inputs to the first and second signal paths can be matched to a predetermined impedance using a matching circuit (not shown) which can be as simple as a resistor placed across the differential inputs.

Figure 5:
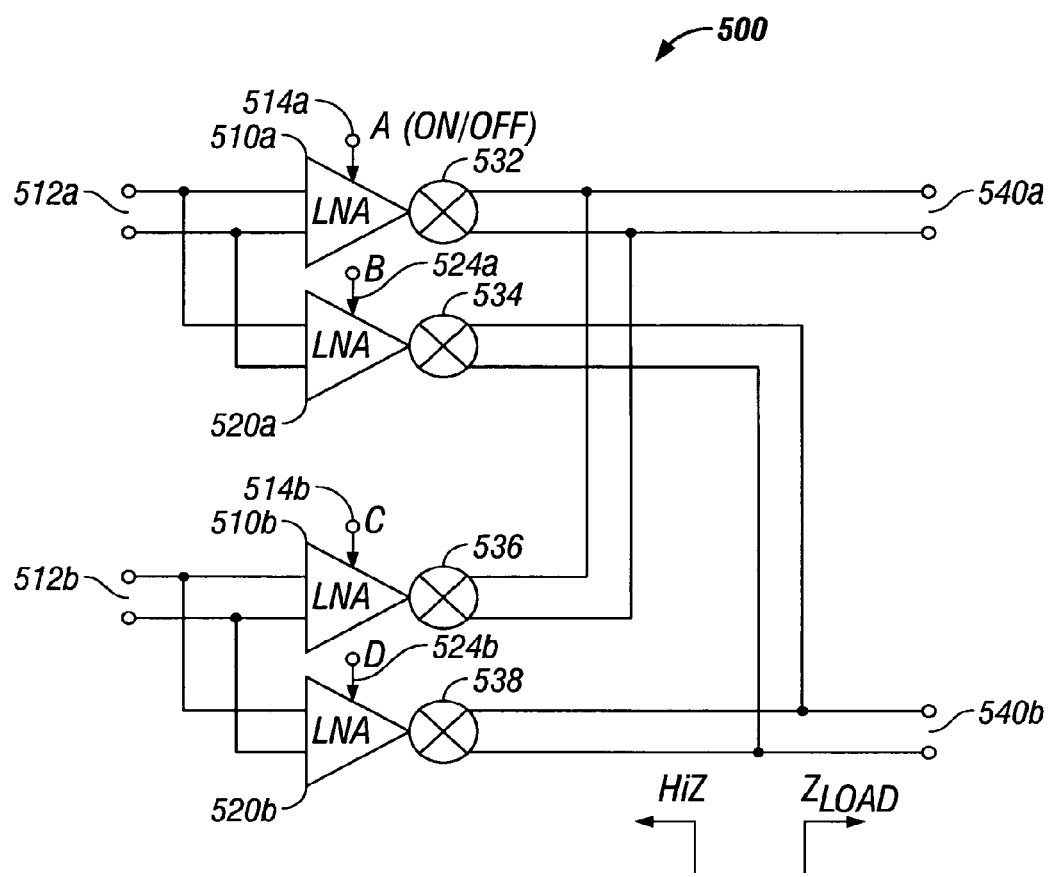
FIG. 5 is a functional block diagram of an integrated crosspoint switch with band translation.

FIG. 5 is a functional block diagram of a crosspoint switch with band translation 500 having LNA/band translation device pairs for each input/output combination and summing the outputs of the band translation devices in the current domain. As with the crosspoint switch with band translation devices of FIGS. 2 and 4, the crosspoint switch with band translation 500 can be combined with LNBs in the receiver 180 of FIG. 1. The devices in the crosspoint switch with band translation 500 utilize differential signals to minimize noise, but single-ended devices can be used in other embodiments.

Each LNA/band translation pair can selectively provide a signal to an output or be controlled to isolate the signal at the input from the output. The LNA can be selectively controlled to isolate the signal by removing the bias, or by reversing the bias on the amplifier. For example, the controller in the set top box 160a of FIG. 1 can receive user input and control the bias control pins, labeled A, B, C, and D, to selectively enable or disable the bias to the LNAs 510a-b, 520a-b.

A first LNA/band translation device pair includes a first LNA 510a connected to a first input 512a. The first LNA 510a is controlled to selectively amplify or isolate the input signal based on a signal provided to its control input 514a. The output of the first LNA 510a is connected to a first band translation device 532 having a high output impedance. The output of the first band translation device 532 is connected to a first signal output 540a.

A second LNA/band translation device pair includes a second LNA 520a having an input connected to the first input 512a. The controller in the set top box can control the control input 524a of the second LNA 520a to selectively amplify or isolate the input signal. The output of the second LNA 520a is connected to a second band translation device 534 having a high output impedance. The output of the second band translation device 534 is connected to a second signal output 540b.

Thus, in order to selectively route a signal from the first input 512a to the first signal output 540a, the controller in the set top box selectively controls the first LNA 5110a to amplify the input signal by providing an enable signal to the control input, 514a, on the first LNA 510a. In order to isolate a signal at the first input 512a from the first output 540a, the first LNA 510a is selectively controlled to isolate the signal.

A second differential input 512b is connected to the inputs of a third LNA 510b and a fourth LNA 520b. The third LNA 510b is controlled to selectively amplify or isolate the input signal based on a signal provided to its control input 514b. The output of the third LNA 510b is connected to a third band translation device 536 having a high output impedance. The output of the third band translation device 536 is connected to a first signal output 540a.

Similarly, the fourth LNA 520b is controlled to selectively amplify or isolate the input signal based on a signal provided to its control input 524b. The output of the fourth LNA 520b is connected to a fourth band translation device 538 having a high output impedance. The output of the fourth band translation device 538 is connected to a first signal output 540b.

Thus, a signal provided to the second differential input 512b can selectively be routed to the first or second signal outputs, 540a or 540b or simultaneously to both signal outputs. In order to route the signal from the second input 512b to the first signal output 540a, a control signal is provided to the control input 514b of the third LNA 510b to enable the third LNA 510b to amplify the second input signal. In order to route the signal from the second input 512b to the second signal output 540b, a control signal is provided to the control input 524b of the fourth LNA 520b to enable the fourth LNA 520b to amplify the second input signal.

The outputs of the first and third band translation devices 532, 536 can be summed at the load if both signals are routed to the first signal output 540a. Similarly, the outputs of the second and fourth band translation devices 534 and 538 can be summed at the load if both provide signals to the second signal output 540b. Thus, by using current outputs from high impedance devices driving matched impedance loads, multiple signals can be summed in a common node.

Figure 6:
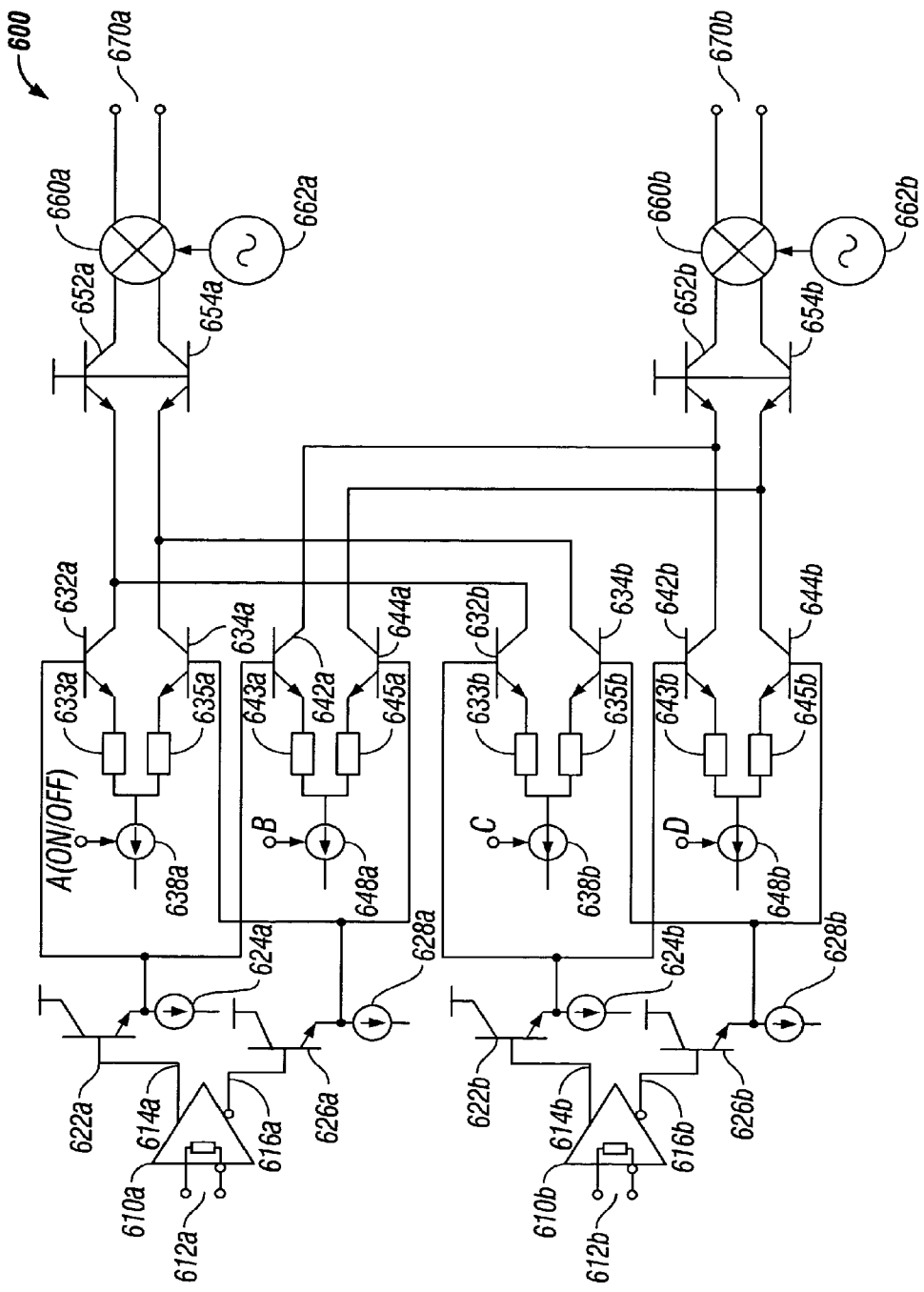
FIG. 6 is a functional block diagram of an integrated crosspoint switch with band translation.

FIG. 6 is another embodiment of a 2×2 crosspoint switch with band translation 600. The specific embodiment is optimized for implementation within a single integrated circuit having impedance matched inputs and outputs. It is evident that the number of inputs or outputs can be expanded to any other number. The embodiment uses current mode switching. LNA's having a matched input, variable gain, and a low impedance output are used. Signals at a first input 612a can be routed, using first and second transconductance devices, to one or both outputs 670a and 670b. Similarly, signals at a second input 612b can be routed, using third and fourth transconductance devices, to one or both outputs 670a and 670b.

The 2×2 crosspoint switch with band translation 600 receives the input signal at a matched signal input of the low noise amplifiers. The low noise amplifiers generate intermediate signals at their low impedance outputs. The intermediate signals are provided to high impedance inputs of current sources configured as transconductance devices. A controller can selectively control the transconductance devices to provide an output current based in part on the intermediate signal. Additionally, the controller can selectively enable or disable each of the transconductance devices. For example, the bias to each of the transconductance device may be controllable to selectively enable or disable the device. Alternatively, the bias current may be varied linearly to control the gain of the transconductance devices. Alternatively, the gain may be varied via other means and the transconductor may be enabled and disabled by other means.

The current output of the transconductance devices can then be received at low impedance inputs of band translation devices that can frequency translate the current signals from a first frequency band to a second frequency band. The band translation devices can have matched impedance outputs.

A first signal path is configured to amplify, band translate, and route a first signal to one of two outputs. A first LNA 610a has a differential input 612a configured to accept the first signal. The input 612a of the first LNA 6110a can be a differential input that is matched to a predetermined impedance, such as 75 Ω or 50 Ω. The differential output of the first LNA 610a has an in-phase output 614a and an inverted output 616a. The differential output of the first LNA 610a can be a low output impedance, a matched output impedance, or a high output impedance. The output impedance of the first LNA 610a can be, for example, 200 ohms differential.

The in-phase output 614a of the first LNA 610a is connected to a first emitter follower 622a that has a low output impedance. The in-phase output 614a of the first LNA is connected to the base of the first emitter follower 622a. The emitter of the first emitter follower 624a is connected to a current source 624a that biases the first emitter follower 624a. The output of the first emitter follower 624a is connected to the in-phase inputs of the differential inputs to first and second transconductance devices. The transconductance devices have high input impedances. The transconductance devices can be bipolar devices that can be selectively enabled or disabled by controlling the bias currents.

Similarly, the inverted output 616a of the first LNA is connected to the input of a second emitter follower 626a. The second emitter follower 626a is biased using a current source 628a connected to its emitter. The output of the second emitter follower 626a is connected to the inverted inputs of the first and second transconductance devices.

Alternatively, the first and second emitter followers, 622a and 626a, with their associated current sources, 624a and 628a, can be considered the low impedance output stage of the first LNA 610a.

The first transconductance device includes a first transistor 632a with the base of the first transistor 632a serving as the in-phase input of the first transconductance device. A first resistor 633a connects the emitter of the first transistor 632a to a controllable current source 638a. The base of a second transistor 634a is used as the inverted input of the first transconductance device. A second resistor 635a connects the emitter of the second transistor 634a to the controllable current source 638a.

The controllable current source 638a provides the bias for the transistors, 632a and 634a of the first transconductance device. The controllable current source 638a can be selectively enabled or disabled based on a control signal. The first transconductance device isolates a signal at its input from its output when the controllable current source 638a is disabled, and conversely, provides a current output that can be proportional to the input signal when the controllable current source 638a is enabled.

A first differential buffer amplifier having two transistors 652a and 654a is used to sum the currents from multiple transconductance devices and provide a differential signal to the first band translation device 660a.

The first band translation device 660a is configured with a low input impedance and an output impedance matched to a predetermined impedance. For example, the output of the first band translation device 660a can be matched to 75 Ω. The differential output of the first band translation device 660a is connected to the first signal output 670a. The first band translation device 660a is driven with a first LO 662a. The first LO 662a frequency can be tunable to allow the frequency translation of the first band translation device 662a to be tuned. Alternatively the output frequency of the first LO 662a can be fixed. The first band translation device 662a can be configured to frequency translate the signal or to pass the signal without frequency translation.

The first LNA 610a also provides a signal that can be selectively routed to a second output 670b. The differential outputs from the first and second emitter followers, 622a and 626a are connected to the differential inputs of a second transconductance device.

The base of a first transistor 642a in the second transconductance device is connected to the in-phase output from the first emitter follower 622a. The base of a second transistor 644a in the second transconductance device is connected to the inverted output from the second emitter follower 626a. Resistors 643a and 645a connect the emitters of the first and second transistors 642a and 644a to a controllable current source 648a that selectively provides bias to the first and second transistors 642a and 644a. The second transconductance device provides an output current when the controllable current source 648a is enabled. Conversely, the second transconductance device does not provide an output current when the controllable current source 648a is disabled.

The differential output from the second transconductance device is connected to the differential input of a second differential buffer amplifier. The second differential buffer amplifier includes two transistors 652b and 654b and is used to sum the currents from multiple transconductance devices and provide a differential signal to the second band translation device 660b.

The output of the second differential buffer amplifier is connected to the differential input of a second band translation device 660b. The second band translation device 660b has with a low input impedance and an output impedance matched to a predetermined impedance such as 75 Ω. The differential output of the second band translation device 660b is connected to the second signal output 670b. The second band translation device 660b is driven with a second LO 662b. The second LO 662b frequency can be tunable to allow the frequency translation of the second band translation device 662b to be tuned. Alternatively the output frequency of the second LO 662b can be fixed. The second band translation device 662b can be configured to frequency translate the signal or to pass the signal without frequency translation.

The second signal input 612b is connected to the second LNA 610b and through third and fourth transconductance devices to the first and second differential buffer amplifiers in a configuration that is similar to the path from the first signal input 612a to the differential buffer amplifiers.

The second signal input 612b is connected to the input of the second LNA 610b. The differential output of the second LNA is connected to a pair of emitter followers, one emitter follower for each of the signal outputs of the second LNA 610b.

The in-phase LNA output 614b is connected to a first emitter follower 622b that includes a first current source 624b connected to its emitter to provide a bias. The inverted LNA output 616b is connected to a second emitter follower 626b that includes a second current source 628b connected to its emitter to provide a bias.

The output of the first emitter follower 622b is connected to the in-phase inputs of third and fourth transconductance devices. The output of the second emitter follower 626b is connected to the inverted inputs of the third and fourth transconductance devices.

The third transconductance device includes first and second transistors 632b and 634b arranged in a differential configuration. The base of the first transistor 632b is the in-phase input of the transconductance device and the base of the second transistor 634b is the inverted input of the third transconductance device. The emitters of the first and second transistors, 632b and 634b, are connected via first and second resistors, 633b and 635b, to a controllable current source 638b. The controllable current source selectively enables or disables the third transconductance device. The collectors of the first and second transistors, 632b and 634b, are connected to the differential inputs of the first differential buffer amplifier.

Similarly, the fourth transconductance device includes first and second transistors 642b and 644b arranged in a differential configuration. The base of the first transistor 642b is the in-phase input of the transconductance device and the base of the second transistor 644b is the inverted input of the fourth transconductance device. The emitters of the first and second transistors, 642b and 644b, are connected via first and second resistors, 643b and 645b, to a controllable current source 648b. The controllable current source 648b selectively enables or disables the fourth transconductance device. The collectors of the first and second transistors, 642b and 644b, are connected to the differential inputs of the second differential buffer amplifier. Of course, the transconductance devices shown in FIG. 6 only represent embodiments of typical transconductance devices. Other embodiments of transconductance devices may be used in other embodiments.

Thus, various crosspoint switch with band translation devices have been disclosed. The devices can be implemented in single integrated circuits and can be configured to switch any number, N, of inputs to any number, M, outputs. The devices can be configured to perform voltage mode switching of signals or current mode switching of signals. One or more input signals can be routed to the same signal output. Additionally, one input signal can be routed to one or more signal outputs. Additionally, the device can be configured to selectively perform frequency band translation of the input signals. One or more of the crosspoint switch with band translation devices can be combined with LNBs to provide a receiver for a signal distribution system. Alternatively, the LNB's can be remote from the crosspoint switch with band translation. The use of crosspoint switch with band translation devices allows greater flexibility in signal routing within the signal distribution system.

The switch configuration provides input and output signal isolation. The configuration of input and output impedances for the intermediate stages of the crosspoint switch with band translation ensures minimal switching transients. The configuration of input and output impedances for the intermediate stages is based in part on whether voltage mode or current mode switching is implemented. A controllable current source can be used to selectively enable and disable transconductance devices to enable switching of signals. Differential signals can also be used to further minimize noise induced onto the desired signals.

Electrical connections, couplings, and connections have been described with respect to various devices or elements. The connections and couplings can be direct or indirect. A connection between a first and second device can be a direct connection or can be an indirect connection. An indirect connection can include interposed elements that can process the signals from the first device to the second device.

Those of skill in the art will understand that information and signals can be represented using any of a variety of different technologies and techniques. For example, data, instructions, commands, information, signals, bits, symbols, and chips that can be referenced throughout the above description can be represented by voltages, currents, electromagnetic waves, magnetic fields or particles, optical fields or particles, or any combination thereof.

Those of skill will further appreciate that the various illustrative logical blocks, modules, circuits, and algorithm steps described in connection with the embodiments disclosed herein can be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled persons can implement the described functionality in varying ways for each particular application, but such implementation decisions should not be interpreted as causing a departure from the scope of the present invention.

The various illustrative logical blocks, modules, and circuits described in connection with the embodiments disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor can be a microprocessor, but in the alternative, the processor can be any processor, controller, microcontroller, or state machine. A processor can also be implemented as a combination of computing devices, for example, a combination of a DSP and a microprocessor, a plurality of microprocessors, one or more microprocessors in conjunction with a DSP core, or any other such configuration.

The steps of a method or algorithm described in connection with the embodiments disclosed herein can be embodied directly in hardware, in a software module executed by a processor, or in a combination of the two. A software module can reside in RAM memory, flash memory, ROM memory, EPROM memory, EEPROM memory, registers, hard disk, a removable disk, a CD-ROM, or any other form of storage medium. An exemplary storage medium can be coupled to the processor such the processor can read information from, and write information to, the storage medium. In the alternative, the storage medium can be integral to the processor. The processor and the storage medium can reside in an ASIC.

The above description of the disclosed embodiments is provided to enable any person skilled in the art to make or use the invention. Various modifications to these embodiments will be readily apparent to those skilled in the art, and the generic principles defined herein can be applied to other embodiments without departing from the spirit or scope of the invention. Thus, the invention is not intended to be limited to the embodiments shown herein but is to be accorded the widest scope consistent with the principles and novel features disclosed herein.

What is claimed is:

1. An N-input by M-output crosspoint switch with frequency translation integrated circuit for use in distributing signals supplied from N input sources coupled to the N-input by M-output crosspoint switch, the integrated circuit comprising:
    an N-input by M-output crosspoint switch configured to route a signal supplied to any one of the N inputs to any one or more of the M outputs, the N-input by M-output crosspoint switch comprising N groups of M switches, each group of M switches having one switch input and M switch outputs, each of the N switch inputs configured to couple to a separate one of the N signal sources, wherein each of the N switch inputs has a high input impedance relative to the output impedance of the input source supplying said signal thereto; and
    a plurality of M frequency translation devices, each M frequency translation device coupled to one of the M switch outputs,
    wherein (i) each of the frequency translation devices has a high input impedance relative to the output impedance of each of the N input sources, wherein each switch in the N groups of M switches comprises a voltage mode switch, and wherein the voltage mode switch is operable to present the high input impedance of one or more of the M frequency translation devices to one or more of the N switch inputs, or (ii) each switch in the N groups of M switches comprises a current mode switch having a high input impedance relative to the output impedance of each of the N input sources.

2. The integrated circuit of claim 1, wherein each current mode switch comprises a transconductance device.

3. The integrated circuit of claim 2, wherein each current mode switch is selectively enabled or disabled based on a control signal.

4. The integrated circuit of claim 1, wherein each voltage mode switch comprises a switch.

5. The integrated circuit of claim 1, wherein each voltage mode switch or current mode switch in the N groups of M switches is operable to provide greater than 30 dB of signal isolation.

6. The integrated circuit of claim 1, further comprising N low noise amplifiers (LNAs) with each LNA having an output coupled to a separate input on the N input switch.

7. The integrated circuit of claim 1, wherein the N-input by M-output crosspoint switch and the M frequency translation devices include differential signal inputs and differential signal outputs.

8. The integrated circuit of claim 1, further comprising a first low noise amplifier (LNA) having a differential input and a low impedance differential output,
    wherein the N-input by M-output crosspoint switch comprises:
        a first transconductance device having a differential output and a high impedance differential input connected to the low impedance differential output of the first LNA; and
        a second transconductance device having a differential output and a high impedance differential input connected to the low impedance differential output of the first LNA; and
    wherein the M frequency translation devices comprise:
        a first frequency translation device having a differential output and a low impedance differential input connected to the differential output of the first transconductance device; and
        a second frequency translation device having a differential output and a low impedance differential input connected to the differential output of the second transconductance device.

9. The integrated circuit of claim 8, wherein the first transconductance device comprises a controllable current source configured to selectively enable and disable the first transconductance device.

10. A method of routing signals in a reconfigurable signal distribution system, the method comprising:
    receiving a signal at a matched impedance input of an amplifier having a low output impedance;
    selectively routing an output voltage of the amplifier, using a first transconductance device having a high impedance input, as a current at an output of the first transconductance device;
    selectively routing an output voltage of the amplifier, using a second transconductance device having a high impedance input, as a current at an output of the second transconductance device; and
    frequency translating a signal at the output of the first transconductance device from a first RF frequency to a second RF frequency using a first frequency translation device.

11. A method of routing signals in a reconfigurable signal distribution system, the method comprising:
    receiving an input signal at a matched impedance input of an input device;
    generating an intermediate signal, based in part on the input signal, at a low impedance output of the input device;
    providing the intermediate signal to a high impedance input of a transconductance device;

selectively enabling the transconductance device to provide an output current signal based in part on the intermediate signal;
receiving the output current signal at a low impedance input of a frequency translation device; and
frequency translating the output current signal from a first frequency to a second frequency.

* * * * *